(12) United States Patent
McCamy et al.

(10) Patent No.: US 11,014,118 B2
(45) Date of Patent: May 25, 2021

(54) FLOAT BATH COATING SYSTEM

(71) Applicant: Vitro S.A.B. de C.V., Nuevo Leon (MX)

(72) Inventors: James W. McCamy, Export, PA (US); Cheng-Hung Hung, Wexford, PA (US); Mehran Arbab, Pasadena, CA (US); Abhinav Bhandari, Cranberry Township, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 255 days.

(21) Appl. No.: 14/967,953

(22) Filed: Dec. 14, 2015

(65) Prior Publication Data

US 2017/0165706 A1    Jun. 15, 2017

Related U.S. Application Data

(60) Provisional application No. 62/266,239, filed on Dec. 11, 2015.

(51) Int. Cl.
| | | |
|---|---|---|
| *C23C 24/04* | (2006.01) | |
| *B05C 5/02* | (2006.01) | |

(Continued)

(52) U.S. Cl.
CPC ............... *B05C 5/02* (2013.01); *B05C 11/10* (2013.01); *C03C 14/004* (2013.01); *C03C 17/002* (2013.01); *C03C 17/007* (2013.01); *C03C 17/22* (2013.01); *C03C 17/25* (2013.01); *C03C 17/28* (2013.01); *C03C 17/34* (2013.01); *C03C 17/38* (2013.01); *C23C 14/046* (2013.01); *C23C 14/16* (2013.01); *C23C 14/165* (2013.01);

(Continued)

(58) Field of Classification Search
None
See application file for complete search history.

(56) References Cited

U.S. PATENT DOCUMENTS

| | | | | |
|---|---|---|---|---|
| 2,920,001 A | * | 1/1960 | Smith | ...................... B05B 7/201 |
| | | | | 118/308 |
| 3,681,042 A | * | 8/1972 | Edwards et al. | ........ C03B 18/14 |
| | | | | 65/60.2 |

(Continued)

FOREIGN PATENT DOCUMENTS

| | | | | |
|---|---|---|---|---|
| DE | 102004029911 A1 | * | 1/2005 | ............... C23C 4/12 |
| EP | 0 518 755 41 | | 12/1992 | |

(Continued)

OTHER PUBLICATIONS

English translation of DE102004029911.*

(Continued)

*Primary Examiner* — Charles Capozzi
(74) *Attorney, Agent, or Firm* — The Webb Law Firm

(57) ABSTRACT

A float bath coating system includes at least one nanoparticle coater located in a float bath. The at least one nanoparticle coater includes a housing, a nanoparticle discharge slot, a first combustion slot, and a second combustion slot. The nanoparticle discharge slot is connected to a nanoparticle source and a carrier fluid source. The first combustion slot is connected to a fuel source and an oxidizer source. The second combustion slot is connected to a fuel source and an oxidizer source.

19 Claims, 10 Drawing Sheets

(51) Int. Cl.

| | | |
|---|---|---|
| *C03C 17/22* | (2006.01) | |
| *C03C 17/28* | (2006.01) | |
| *C03C 17/34* | (2006.01) | |
| *C03C 17/38* | (2006.01) | |
| *C23C 14/04* | (2006.01) | |
| *C23C 14/16* | (2006.01) | |
| *C03C 14/00* | (2006.01) | |
| *C03C 17/00* | (2006.01) | |
| *C23C 14/58* | (2006.01) | |
| *B05C 11/10* | (2006.01) | |
| *H01L 31/054* | (2014.01) | |
| *F21V 8/00* | (2006.01) | |
| *H01L 31/055* | (2014.01) | |
| *H01L 51/00* | (2006.01) | |
| *H01L 51/52* | (2006.01) | |
| *C03C 17/25* | (2006.01) | |
| *H01L 51/56* | (2006.01) | |
| *H01L 51/44* | (2006.01) | |

(52) U.S. Cl.
CPC .......... *C23C 14/5806* (2013.01); *C23C 24/04* (2013.01); *G02B 6/0003* (2013.01); *G02B 6/0065* (2013.01); *G02B 6/0073* (2013.01); *H01L 31/054* (2014.12); *H01L 31/055* (2013.01); *H01L 51/0096* (2013.01); *H01L 51/52* (2013.01); *H01L 51/5268* (2013.01); *H01L 51/56* (2013.01); *C03C 2217/21* (2013.01); *C03C 2217/42* (2013.01); *C03C 2217/70* (2013.01); *C03C 2218/152* (2013.01); *C03C 2218/1525* (2013.01); *C03C 2218/31* (2013.01); *C03C 2218/32* (2013.01); *H01L 51/447* (2013.01); *H01L 2251/5369* (2013.01); *Y02E 10/52* (2013.01); *Y02E 10/549* (2013.01)

(56) References Cited

U.S. PATENT DOCUMENTS

| | | | |
|---|---|---|---|
| 4,520,756 A * | 6/1985 | Hayashi | B05B 7/205 |
| | | | 118/302 |
| 4,559,218 A * | 12/1985 | Flemmert | B01J 12/005 |
| | | | 423/336 |
| 4,600,390 A * | 7/1986 | Gobel | A61C 13/0003 |
| | | | 106/35 |
| 4,924,936 A | 5/1990 | McKown | |
| 5,322,540 A * | 6/1994 | Jacquet | C03C 17/002 |
| | | | 65/60.2 |
| 5,356,451 A | 10/1994 | Cain et al. | |
| 5,683,516 A | 11/1997 | DeDontney et al. | |
| 6,174,599 B1 | 1/2001 | Boire et al. | |
| 7,730,747 B2 | 6/2010 | Galante et al. | |
| 2003/0037569 A1* | 2/2003 | Arbab | B05C 19/04 |
| | | | 65/22 |
| 2005/0011395 A1* | 1/2005 | Langan | F42B 1/032 |
| | | | 102/476 |
| 2005/0089693 A1 | 4/2005 | Fujisawa et al. | |
| 2006/0289832 A1 | 12/2006 | Watchi et al. | |
| 2008/0280056 A1* | 11/2008 | Maric | B05B 7/1646 |
| | | | 427/446 |
| 2009/0096021 A1 | 4/2009 | Rajala | |
| 2009/0233088 A1 | 9/2009 | Lewis et al. | |
| 2009/0304941 A1* | 12/2009 | McLean | C03C 17/002 |
| | | | 427/446 |
| 2010/0047554 A1* | 2/2010 | Rajala | C03C 17/23 |
| | | | 428/323 |
| 2011/0017287 A1 | 1/2011 | Borrelli et al. | |
| 2011/0154860 A1 | 6/2011 | Arbab et al. | |
| 2011/0229644 A1 | 9/2011 | Rajala et al. | |
| 2012/0040175 A1* | 2/2012 | Hurst | C23C 18/1229 |
| | | | 428/323 |
| 2012/0200929 A1 | 8/2012 | Lu | |
| 2012/0315709 A1* | 12/2012 | Vainio | B82Y 20/00 |
| | | | 438/5 |
| 2013/0101745 A1* | 4/2013 | Meillot | C23C 4/00 |
| | | | 427/455 |
| 2014/0185282 A1 | 7/2014 | Hsu et al. | |
| 2016/0365541 A1 | 12/2016 | Wehlus | |

FOREIGN PATENT DOCUMENTS

| | | |
|---|---|---|
| JP | 2013115213 A | 6/2013 |
| JP | 2014510364 A | 4/2014 |
| JP | 2014234487 A | 12/2014 |
| RU | 2436882 C2 | 8/2010 |
| RU | 2417902 C1 | 5/2011 |
| RU | 2439199 A | 7/2011 |
| RU | 2462536 C1 | 9/2012 |
| WO | WO 0128941 A1 | 4/2001 |
| WO | 2004035496 A2 | 4/2004 |
| WO | 2009114061 A2 | 9/2009 |
| WO | 2015124489 A1 | 8/2015 |

OTHER PUBLICATIONS

PCT Search Report, PCT/US2016/065875, dated Mar. 16, 2017.
U.S. Appl. No. 14/967,981, flied Dec. 14, 2015, McCamy et al, Nanoparticle Coater.
U.S. Appl. No. 14/968,011, filed Dec. 14, 2015, McCamy et al, Glass Articles With Nanoparticle Regions.
U.S. Appl. No. 14/968,039, filed Dec. 14, 2015, McCamy et al, Glass Drawdown Coating System.

* cited by examiner

FLOAT BATH COATING SYSTEM

CROSS-REFERENCE TO RELATED APPLICATION

This application claims priority to Provisional Application No. 62/266,239, filed Dec. 11, 2015, which is herein incorporated by reference in its entirety.

BACKGROUND OF THE INVENTION

Field of the Invention

This invention relates generally to organic light emitting diodes, solar or photovoltaic (PV) cells, daylighting windows, light extracting substrates, substrates with friction modified surfaces, and methods of making the same.

Technical Considerations

An organic light emitting diode (OLED) is a light-emitting device having an emissive electroluminescent layer incorporating organic compounds. The organic compounds emit light in response to an electric current. Typically, an emissive layer of organic semiconductor material is situated between two electrodes (an anode and a cathode). When electric current is passed between the anode and the cathode, the organic material emits light. OLEDs are used in numerous applications, such as television screens, computer monitors, mobile phones, PDAs, watches, lighting, and various other electronic devices.

OLED provide numerous advantages over conventional inorganic devices, such as liquid crystal displays. For example, an OLED can function without the need for a back light. In low ambient light, such as a dark room, an OLED screen can achieve a higher contrast ratio than conventional liquid crystal displays. OLEDs typically are also thinner, lighter, and more flexible than liquid crystal displays and other lighting devices. OLEDs typically also require less energy to operate than many other conventional lighting devices.

However, one disadvantage with OLED devices is that they typically emit less light per unit area than inorganic solid-state based point-light sources. In a typical OLED lighting device, a large percentage of the light emitted from the organic material is trapped inside the device due to the optical waveguide effect in which the light from the organic emitting layer is reflected back from the interface of the organic emitting layer/conductive layer (anode), the interface of the conductive layer (anode)/substrate, and the outer surface/air interface. Only a relatively small percentage of the light emitted from the organic material escapes the optical waveguide effect and is emitted by the device. Therefore, it would be advantageous to provide a device and/or method to extract more light from an OLED device than is possible with conventional methods.

Photovoltaic solar cells are in principle counterparts to light emitting diodes. Here, the semiconductor material absorbs the energy of light (photons) and converts that energy into electricity. Similar to OLEDs, the efficiency of the photovoltaic device is relatively low. At the module level, for example, typically only up to 20% of the incident light is converted to electric energy. In one class of photovoltaic devices, those consisting of thin film PV cells, this efficiency can be much lower, depending on the semiconducting material and the junction design. Therefore, it would be advantageous to increase the fraction of the solar light that is absorbed near the photovoltaic semiconductor junction to increase the efficiency of the photovoltaic device.

OLEDs and photovoltaic devices are typically made in batch coating processes in which each coating layer is applied in a coating station. The substrate is then transferred to another separate coating station for application of the next layer, and so on. This is a time intensive and labor intensive process. It would be advantageous if two or more of the coating layers or functional regions of the device could be made in a continuous process rather than a batch process. It would also be advantageous if the friction coefficient of a substrate could be modified, for example in a continuous coating process.

SUMMARY OF THE INVENTION

A float glass system includes at least one nanoparticle deposition coater and, optionally, at least one vapor deposition coater. A float bath coating system includes at least one nanoparticle coater located in a float bath. The at least one nanoparticle coater includes a housing, a nanoparticle discharge slot, a first combustion slot, and a second combustion slot. The nanoparticle discharge slot is connected to a nanoparticle source and a carrier fluid source. The first combustion slot is connected to a fuel source and an oxidizer source. The second combustion slot is connected to a fuel source and an oxidizer source.

BRIEF DESCRIPTION OF THE DRAWINGS

The invention is illustrated in the accompanying drawing figures wherein like reference characters identify like parts throughout. Unless indicated to the contrary, the drawing figures are not to scale.

DESCRIPTION OF THE PREFERRED EMBODIMENTS

Figure 1:
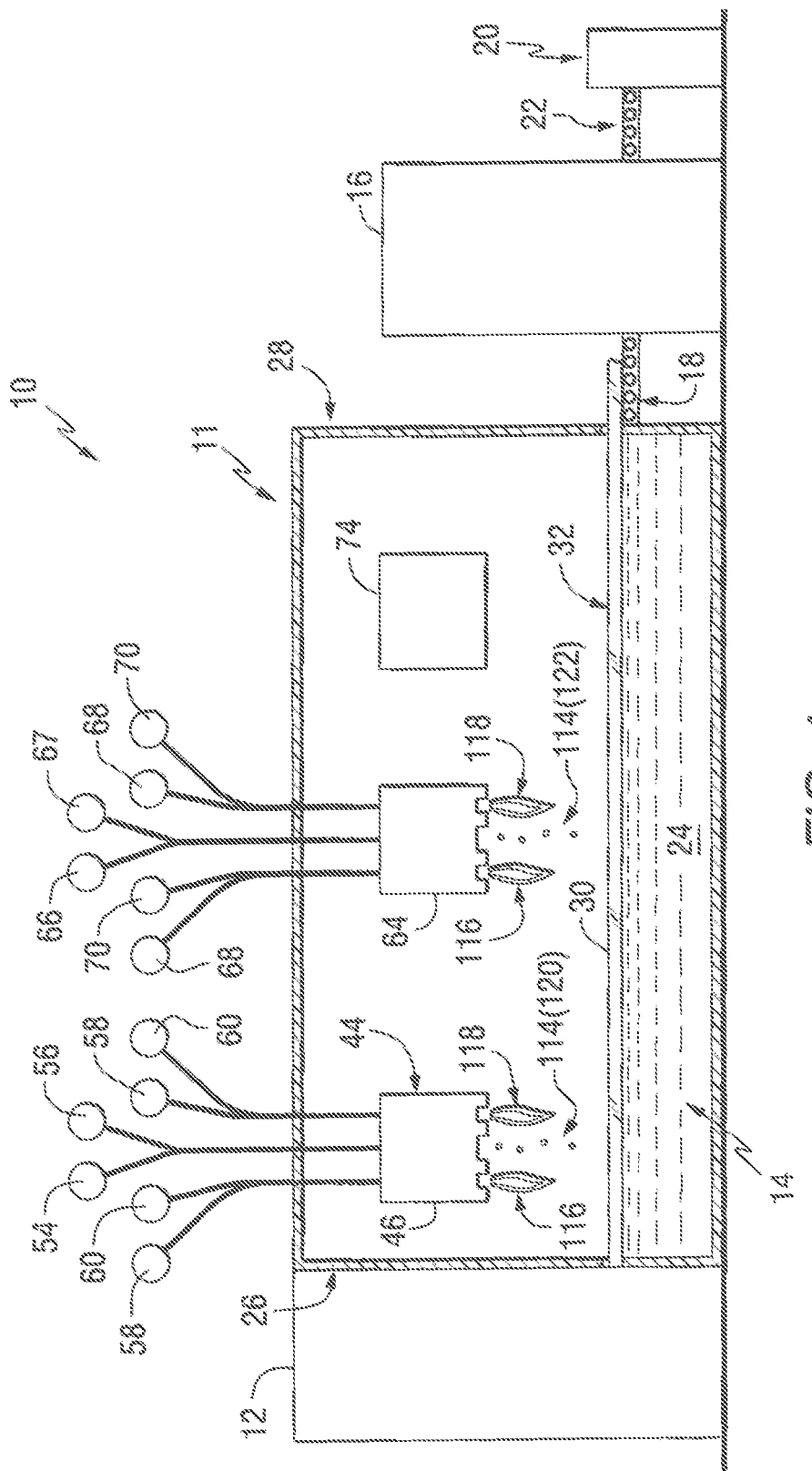
FIG. 1 is a side view of a float glass system incorporating a float bath coating system of the invention.

Spatial or directional terms, such as "left", "right", "inner", "outer", and the like, relate to the invention as it is shown in the drawing figures. It is to be understood that the invention can assume various alternative orientations and, accordingly, such terms are not to be considered as limiting.

All numbers used in the specification and claims are to be understood as being modified in all instances by the term "about". All ranges are to be understood to encompass the beginning and ending range values and any and all subranges subsumed therein. The ranges set forth herein represent the average values over the specified range.

When referring to a layer of a coating, the term "over" means "farther from the substrate surface". For example, a second layer located "over" a first layer means that the second layer is located farther from the substrate surface on which the layers are present than is the first layer. The second layer can be in direct contact with the first layer or one or more other layers can be located between the second layer and the first layer.

The terms "polymer" or "polymeric" include oligomers, homopolymers, copolymers, and terpolymers.

All documents referred to herein are to be considered to be "incorporated by reference" in their entirety.

Any reference to amounts, unless otherwise specified, is "by weight percent".

The term "film" means a region having a desired or selected composition. A "layer" comprises one or more "films". A "coating" is comprised of one or more "layers". The term "organic material" includes polymers as well as small molecule organic materials that can be used to fabricate organic opto-electronic devices.

The term "visible light" means electromagnetic radiation having a wavelength in the range of 360 nm to 780 nm. The term "infrared radiation" means electromagnetic radiation having a wavelength in the range of greater than 780 nm to 100,000 nm. The term "ultraviolet radiation" means electromagnetic energy having a wavelength in the range of 100 nm to less than 380 nm.

The terms "metal" and "metal oxide" include silicon and silica, respectively, as well as traditionally recognized metals and metal oxides, even though silicon may not be conventionally considered a metal. The term "curable" means a composition capable of polymerizing or crosslinking. By "cured" is meant that the material is at least partly polymerized or cross-linked, preferably fully polymerized or cross-linked. By "at least" is meant "greater than or equal to". By "not more than" is meant "less than or equal to". The terms "upstream" and "downstream" refer to the direction of travel of the glass ribbon.

Haze and transmittance values herein are those determined using a Haze-Gard Plus hazemeter (commercially available from BYK-Gardner USA) or a Perkin Elmer Lamda 9 Spectrophotometer. Surface roughness values are those determined using an Instrument Dimension 3100 Atomic Force Microscope.

The discussion of the invention may describe certain features as being "particularly" or "preferably" within certain limitations (e.g., "preferably", "more preferably", or "even more preferably", within certain limitations). It is to be understood that the invention is not limited to these particular or preferred limitations but encompasses the entire scope of the disclosure.

The invention comprises, consists of, or consists essentially of, the following aspects of the invention, in any combination. Various aspects of the invention are illustrated in separate drawing figures. However, it is to be understood that this is simply for ease of illustration and discussion. In the practice of the invention, one or more aspects of the invention shown in one drawing figure can be combined with one or more aspects of the invention shown in one or more of the other drawing figures.

Figure 2:
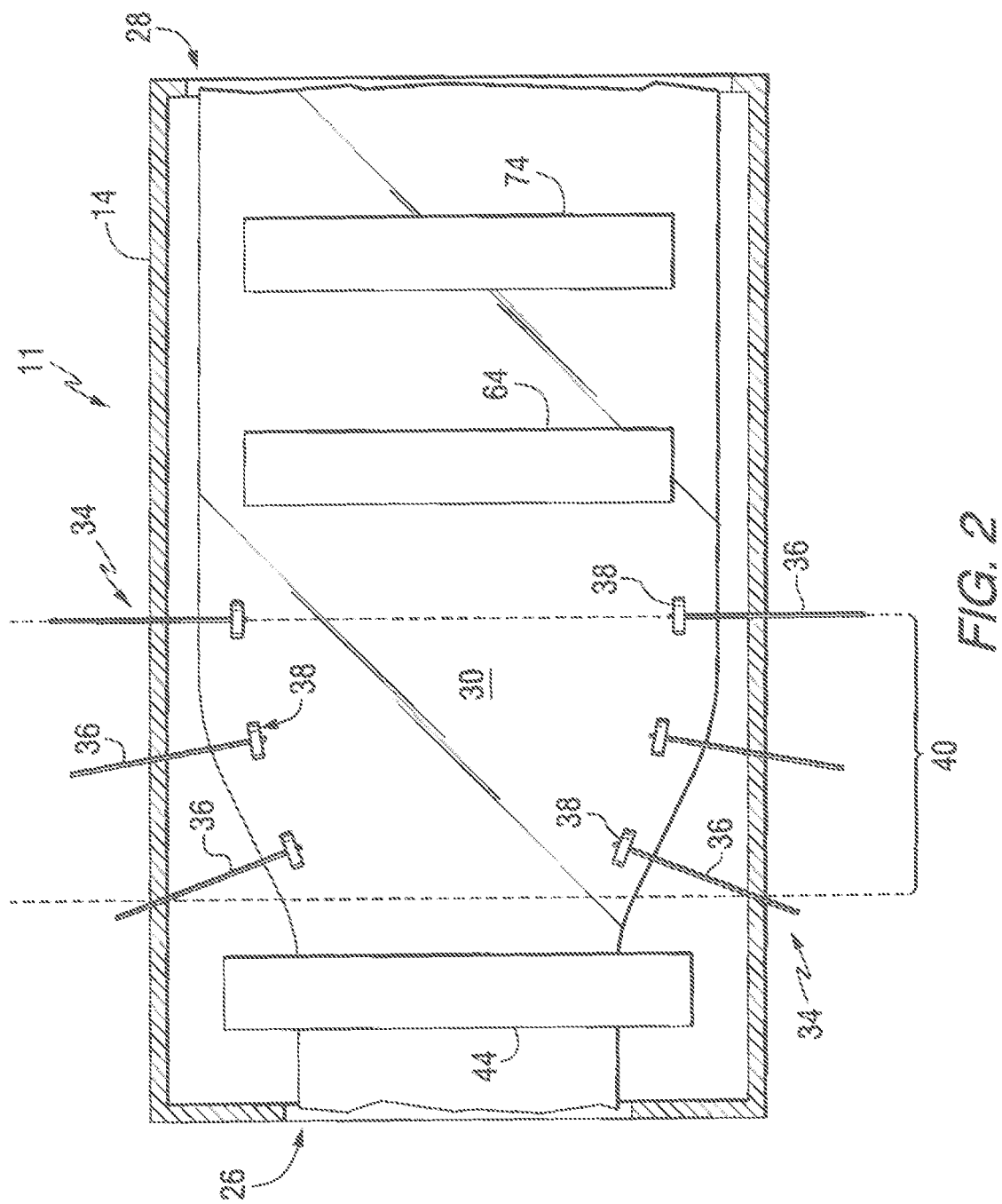
FIG. 2 is a plan view of the float bath coating system of FIG. 1.

An exemplary float glass system 10 incorporating a float bath coating system 11 of the invention is shown in FIGS. 1 and 2. The float glass system 10 includes a glass furnace 12 upstream of a float bath 14. The float bath 14 is located upstream of a cooling lehr 16. A first conveyor 18 extends between the float bath 14 and the lehr 16. A cutting station 20 is located downstream of the lehr 16. A second conveyor 22 extends between the lehr 16 and the cutting station 20.

The float bath 14 includes a pool of molten metal 24, such as molten tin. The float bath 14 has an entrance end 26 adjacent the furnace 12 and an exit end 28 adjacent the first conveyor 18. In the float glass process, molten glass from the furnace 12 is poured onto the top of the molten metal 24 in the float bath 14. The molten glass begins to cool and spreads across the top of the molten metal 24 to form a glass ribbon 30 having a surface 32.

A plurality of opposed sets of roller assemblies 34 are located along the sides of the float bath 14 and extend into the interior of the float bath 14. The roller assemblies 34 include a shaft 36 connected to a rotatable head 38. The head 38 includes a plurality of circumferential teeth configured to grip the glass ribbon 30. Rotation of the roller assembly heads 38 pulls the glass ribbon 30 along the top of the molten metal 24 towards the exit end 28 of the float bath 14. The speed of rotation of the heads 38 affects the thickness of the glass ribbon 30. The faster the speed of rotation, all other parameters remaining equal, the thinner will be the glass ribbon 30. The angle (or tilt) of the heads 38 affects the width of the glass ribbon 30. For example, angling the heads 38 outwardly (towards the outside of the float bath 14) increases the width of the glass ribbon 30. Angling the heads 38 inwardly decreases the width of the glass ribbon 30. This angling of the heads 38 also can affect the thickness of the glass ribbon 30.

The portion of the float bath 14 where the roller assemblies 34 are located is referred to as the "attenuation zone" 40. It is principally in this attenuation zone 40 that the glass ribbon 30 is stretched, for example laterally and/or longitudinally, by operation of the roller assemblies 34.

Figure 3:
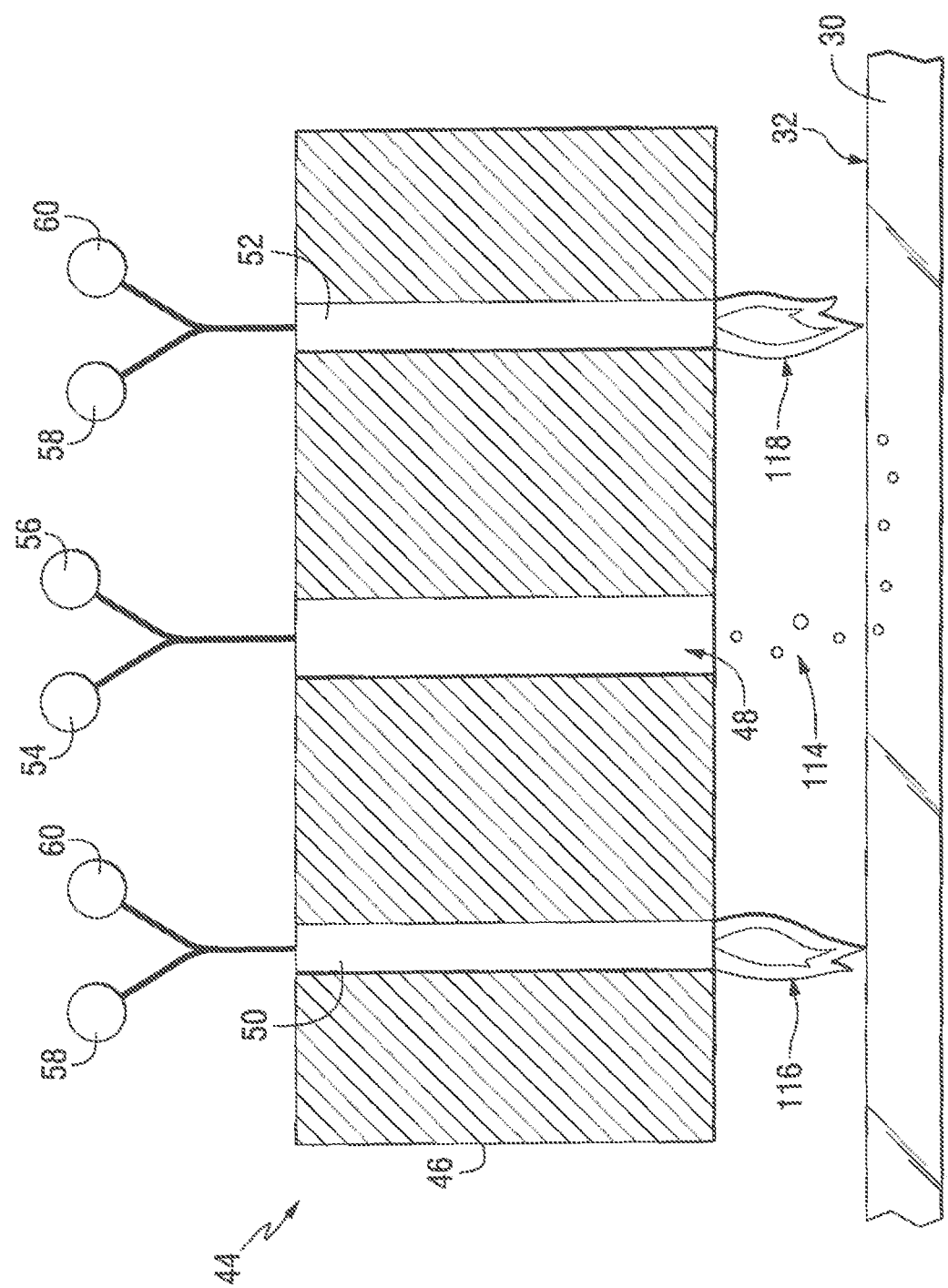
FIG. 3 is a side, sectional view of a nanoparticle coater of the invention.

In the float bath coating system 11, at least one first nanoparticle coater 44 of the invention is located in the float bath 14. As shown in FIGS. 1-3, the first nanoparticle coater 44 includes a housing 46 having a nanoparticle discharge slot 48 and at least one combustion slot. In the illustrated example, the first nanoparticle coater 44 includes a first combustion slot 50 and a second combustion slot 52. In the illustrated example, the nanoparticle discharge slot 48 is located between the first combustion slot 50 and the second combustion slot 52.

The nanoparticle discharge slot 48 is connected to a nanoparticle source 54 and a carrier fluid source 56. The nanoparticle source 54 contains and/or generates and/or supplies nanoparticles or nanoparticle precursor materials for discharge from the nanoparticle discharge slot 48.

The nanoparticles can be produced by any conventional method. In one specific example, a liquid precursor can be heated in a vaporizer to form a vapor. The vapor can be directed to a reaction zone to form the desired nanoparticles. Examples of liquid reactant vaporizers are disclosed in U.S. Pat. Nos. 4,924,936, 5,356,451 and 7,730,747. For example, a metal chloride, such as titanium tetrachloride, can be heated in a vaporizer to form a precursor vapor. The vapor can be directed to the first nanoparticle coater 44 or to a collector. For example, the vaporizer can be connected to the first nanoparticle coater 44. The titanium tetrachloride vapor can be hydrolyzed or oxidized to form titanium dioxide nanoparticles. Other precursors, such as organometallic compounds, can be used. Titanium isopropoxide is an example of another material that can be vaporized to form titanium dioxide nanoparticles. The precursor stream may be composed of one, two or more liquid reactant materials of different compositions so as to form nanoparticles having a pure composition, a composition with mixed phases and/or compositions, or homogeneous alloys of a single or multiple phases. As will be appreciated by one skilled in the art, the liquid reactant materials can be supplied in various ratios to form nanoparticles and/or a mixture of nanoparticles of a desired composition. Further, one or more precursors may be supplied from a gaseous source to form nanoparticles and/or a mixture of nanoparticles of a desired composition. An example of this include supplying hydrogen sulfide as a sulfur containing precursor to form a sulfide containing nanoparticle. Another example is supplying ammonia (NH3) to form a nitride containing nanoparticle.

Examples of suitable nanoparticles include oxide nanoparticles. For example, metal oxide nanoparticles. For example, alumina, titania, cerium oxide, zinc oxide, tin oxide, silica, and zirconia. Other examples include metallic nanoparticles. For example but not limited to iron, steel, copper, silver, gold, and titanium. Further examples include alloy nanoparticles containing alloys of two or more materials. For example, alloys of two or more of zinc, tin, gold, copper, and silver. Additional examples include sulfide-containing nanoparticles and/or nitride-containing nanoparticles. Other examples include luminescent materials and/or photoluminescent materials. For example, phosphors, such as phosphorescent nanoparticles and/or fluorescent nanoparticles. For example, blue, green, and/or red phosphors. Examples include $BaMgAl_{10}O_{17}:Eu^{2+}$; $Y_2O_3$:Eu; ZnS based phosphors, for example, ZnS:Mn and ZnS:Cu; CdS; $Y_2SiO_5:Ce^{3+}$; $Zn_2SiO_4$:Mn; (Ca,Sr)S:Bi; and $SrAl_2O_4$:Eu(II)Dy(III). Additional examples include luminous nanocrystalline materials. For example, nanocrystalline nanoparticles. For example, yttrium oxide doped with europium, yttrium oxide doped with terbium, and/or zinc stannate doped with manganese.

The carrier fluid source 56 supplies a carrier fluid to propel or carry the nanoparticle vapor or nanoparticles from the nanoparticle source 54 to the first nanoparticle coater 44. The carrier fluid preferably comprises a carrier gas. For example, nitrogen or argon.

The combustion slots 50, 52 are connected to a fuel source 58 and an oxidizer source 60. The fuel source 58 comprises a combustible material. For example, natural gas. The oxidizer source 60 comprises an oxygen-containing materiel. For example, air or oxygen gas.

The fuel source 58 for the first combustion slot 50 can be the same or different than that for the second combustion slot 52. That is, the first combustion slot 50 and second combustion slot 52 can be supplied with the same type of fuel. Or, one combustion slot can be supplied with a first fuel and the other combustion slot can be supplied with a second fuel, with the first fuel being the same or different than the second fuel.

The oxidizer source 60 for the first combustion slot 50 can be the same or different than that for the second combustion slot 52. That is, the first combustion slot 50 and second combustion slot 52 can be supplied with the same type of oxidizer. Or, one combustion slot can be supplied with a first oxidizer and the other combustion slot can be supplied with a second oxidizer, with the first oxidizer being the same or different than the second oxidizer.

The above structure allows for the fuel and oxidizer flow rates to be controlled separately from the nanoparticle and carrier fluid flow rates.

The first nanoparticle coater 44 can be located upstream of the attenuation zone 40. Alternatively, the first nanoparticle coater 44 can be located downstream of the attenuation zone 40. Or, the first nanoparticle coater 44 can be located in the attenuation zone 40.

The float bath coating system 11 can include at least one second nanoparticle coater 64. The second nanoparticle coater 64 can be the same as the first nanoparticle coater 44 described above. In the illustrated example, the nanoparticle discharge slot of the second nanoparticle coater 64 is connected to a second nanoparticle source 68 and a second carrier fluid source 67. The combustions slot(s) of the second nanoparticle coater 64 is(are) connected to a second fuel source 68 and a second oxidizer source 70.

The second nanoparticle source 66 can be the same or different than the first nanoparticle source 54. That is, the nanoparticles supplied by the second nanoparticle source 66 can be the same or different than the particles supplied by the first nanoparticle source 54. For example, the first nanoparticle source 54 can provide nanoparticles that are of a different size and/or composition than the nanoparticles supplied by the second nanoparticle source 66. For example, the first nanoparticle source 54 can provide nanoparticles that are smaller and/or denser than the nanoparticles supplied by the second nanoparticle source 66.

The second fuel source 68 can be the same or different than the first fuel source 58. The second oxidizer source 70 can be the same or different than the first oxidizer source 60.

If more than one nanoparticle coater 44, 64 is present, one or more nanoparticle coaters 44, 64 can be located upstream of the attenuation zone 40, and/or one or more nanoparticle coaters 44, 64 can be located downstream of the attenuation zone 40, and/or one or more nanoparticle coaters 44, 64 can be located within the attenuation zone 40.

The nanoparticle coater 44, 64 can be located at a position in the float bath 14 where the glass ribbon 30 has a viscosity such that the nanoparticles discharged from the nanoparticle coater 44, 64 are embedded into the glass ribbon 30 at a desired depth.

Alternatively, the nanoparticle coater 44, 64 can be located at a position where the viscosity of the glass ribbon 30 does not correspond to a viscosity to achieve the desired depth of the nanoparticles. For example, at a position where the temperature of the glass ribbon 30 is below that needed to provide the desired viscosity. In that situation, one or both of the combustion slots 50, 52 can be activated to increase the temperature of the glass ribbon 30 and/or lower the viscosity of the glass ribbon 30 to the desired amount.

The nanoparticle coater 44, 64 can be located at a position in the float bath 14 where the viscosity of the glass ribbon 30 is such that the nanoparticles deposited from the nanoparticle coater 44, 64 are fully embedded into the glass ribbon 30. By "fully embedded" is meant that at least some of the nanoparticles, preferably a majority of the nanoparticles, more preferably all of the nanoparticles, deposited from the nanoparticle coater 44, 64 are completely surrounded by the glass ribbon 30.

The nanoparticles can have a diameter in the range of 25 nanometers (nm) to 1,000 nm, for example 50 nm to 750 nm. For example, 150 nm to 600 nm. For example, 200 nm to 500 nm.

For example, the nanoparticles can be embedded to a depth (i.e., the distance from the surface 32 of the glass ribbon to the edge of the nanoparticles) in the range of 25 nanometers (nm) to 2,000 nm, for example 50 nm to 1,500 nm, for example 100 nm to 750 nm. For example, 150 nm to 600 nm. For example, 200 nm to 500 nm.

In the example shown in FIG. 1, the first nanoparticle coater 44 is located closer to the entrance end 26 of the float bath 14 than the second nanoparticle meter 64. Thus, the temperature of the glass ribbon 30 is higher at the first nanoparticle coater 44 than at the second nanoparticle coater 64. This means that the viscosity of the glass ribbon 30 is lower at the first nanoparticle coater 44 than at the second nanoparticle coater 64. All other factors remaining the same, nanoparticles deposited at the first nanoparticle coater 44 will embed deeper into the glass ribbon 30 than nanoparticles deposited at the second nanoparticle coater 64. Thus, different nanoparticle regions can be formed in the glass ribbon 30.

Alternatively, the nanoparticle coater 44, 64 can be located at a position in the float bath where the viscosity of the glass ribbon 30 is such that the nanoparticles are partially embedded into the glass ribbon 30. By "partially embedded" is meant that at least some of the nanoparticles, preferably a majority of the nanoparticles, more preferably all of the nanoparticles, deposited from the nanoparticle coater 44, 64 are not completely surrounded by the glass ribbon 30. That is, at least a part of at least a portion of the nanoparticles extend above the surface 32 of the glass ribbon 30. For example, a portion of one or more of the nanoparticles extends above the surface of the glass ribbon 30.

At least one vapor deposition coater 74, such as a chemical vapor deposition (CVD) coater, can be located in the float bath 14. For example, the vapor deposition coater 74 can be located downstream of the nanoparticle coaters 44, 64. The vapor deposition coater 74 can be a conventional CVD coater, as will be well understood by one of ordinary skill in the art.

Figure 4:
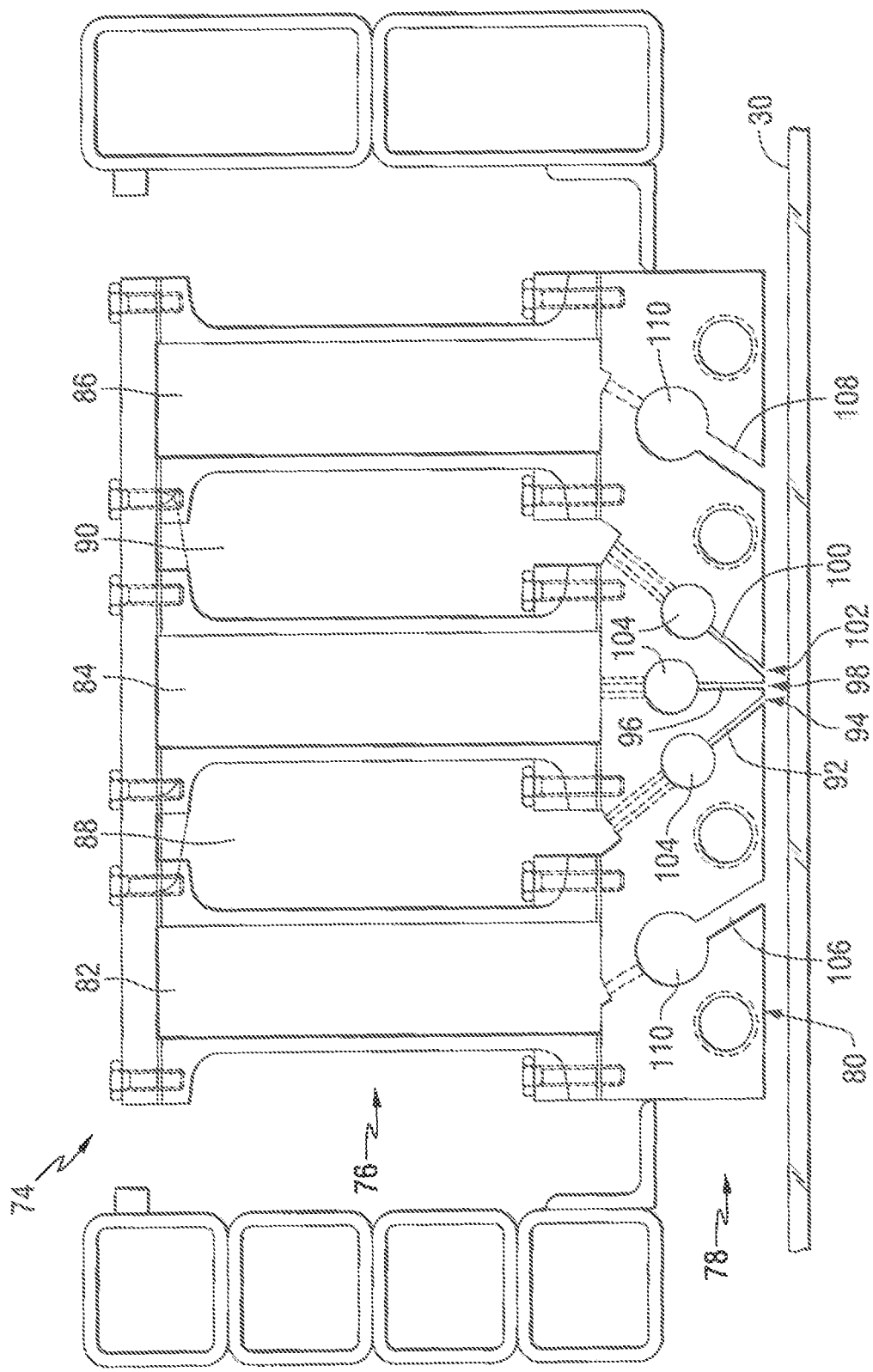
FIG. 4 is a side, sectional view of a vaporization coater of the invention.
Figure 5:
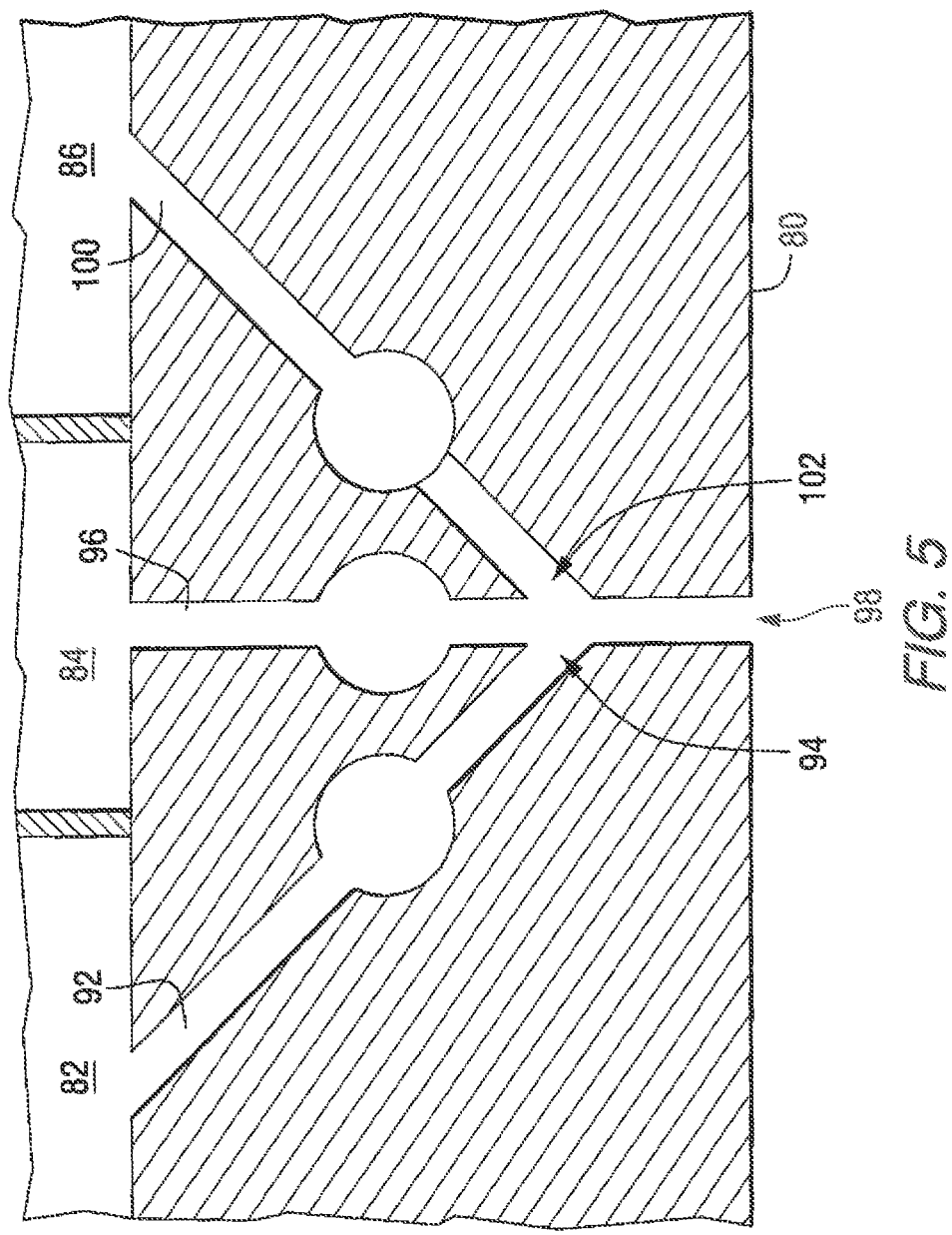
FIG. 5 is a side, sectional view of the vaporization coater of FIG. 4 having a modified nozzle block.

A vapor deposition water 74 particularly well suited for applying volatile precursors is shown in FIGS. 4 and 5. The vapor deposition coater 74 includes a plenum assembly 76 and a nozzle block 78. The nozzle block 78 has a discharge face 80 directed toward the glass ribbon 30. The illustrated exemplary plenum assembly 76 has a first inlet plenum 82, a second inlet plenum 84, and a third inlet plenum 86. The plenum assembly 76 has a first exhaust plenum 88 and a second exhaust plenum 90. The exemplary nozzle block 78 is connected to the plenum assembly 76, such as by bolts.

The first inlet plenum 82 is in flow communication with a first discharge channel 92 having a first discharge outlet (slot) 94. The second inlet plenum 84 is in flow communication with a second discharge channel 96 having a second discharge outlet (slot) 98. The third inlet plenum 86 is in flow communication with a third discharge channel 100 having a third discharge outlet (slot) 102. Inlet mixing chambers 104 can be located in the discharge channels 92, 96, 100.

A first exhaust conduit 106 extends from the discharge face 80 to the first exhaust plenum 88. A second exhaust conduit 108 extends from the discharge face 80 to the second exhaust plenum 90. Exhaust chambers 110 can be located in the exhaust conduits 106, 108.

In the illustrated example, the second discharge channel 96 is perpendicular to the discharge face 80 (i.e. a centerline axis of the second discharge channel 96 is perpendicular to the plane of the discharge face 80). However, the first discharge channel 92 and third discharge channel 100 are angled with respect to the discharge face 80. The centerline axes of the first discharge channel 92 and the third discharge channel 100 intersect at a position below the discharge face 80. Thus, the precursor vapors from the discharge outlets 94, 98, 102 are not mixed until after discharge from the nozzle block 78. This is particularly useful for volatile precursors where premixing of the precursors would cause premature reaction.

The angle of one or more of the discharge channels 92, 96, 100 with respect to the discharge face 80 can be changed so that the centerline axes of two or more of the discharge channels 92, 96, 100 intersect at a desired location (e.g., distance from the discharge face 80 and/or location with respect to an underlying glass ribbon 30). For example, different/interchangeable nozzle blocks 78 having different discharge channel angles can be provided. A nozzle block 78 having the desired discharge channel angles can be selected and bolted onto the plenum assembly 76. Alternatively, the nozzle block 78 can be formed by separate sections. The first exhaust conduit 106 can be in one section, the second exhaust conduit 108 can be in another section, and the discharge channels 92, 96, 100 can be in a third section. The different sections can be individually connectable with the plenum assembly 76. In this aspect, only the section of the nozzle block 78 with the discharge channels 92, 96, 100 would need to be replaced with a section having a desired discharge channel angle.

Alternatively, the first discharge channel 92, second discharge channel 96, and third discharge channel 100 can be located in separate sections of the nozzle block 78 and movably connected, for example slidably connected, to the plenum assembly 76. For example, with reference to FIG. 4, if the first discharge channel 92 is located in one slidable section and the third discharge channel 100 is located in a separate slidable section, sliding the slidable section containing the first discharge channel 92 and/or the other slidable section containing the third discharge channel 100 to the left or the right with reference to FIG. 4 would change the point of intersection of the centerlines of the discharge channels 92, 96, 100. For example, sliding the section containing the first discharge channel 92 to the left and sliding the section containing the third discharge channel 100 to the right in FIG. 4 would increase the distance of the point of intersection with respect to the discharge face 80.

The angles of the discharge channels 92 and/or 100 can be varied such that the centerline axes intersect at a position above the surface of the glass ribbon 30, or at the surface of the glass ribbon 30, or below the surface of the glass ribbon 30. If the calculated intersection is below the surface of the glass ribbon 30, the vapors from the second discharge channel 96 perpendicular to the discharge face 80 form a monolayer on the glass ribbon 30 and the material from the first discharge channel 92 and third discharge channel 100 react with it. In FIG. 4, the centerline axes of the discharge channels 92, 96, 100 would intersect above the glass ribbon 96.

A central portion of a vapor coater 74 having a modified nozzle block 78 is shown in FIG. 5. In this modification, the first discharge outlet 94 and third discharge outlet 102 are in flow communication with the second discharge channel 96 above the discharge face 80. Thus, the vapors from the three discharge channels 92, 96, 100 mix before they are discharged from the second discharge outlet 98.

One or more coating layers can be applied onto the glass ribbon 30 by the vapor deposition coater 74. The coating layers can be applied by selective deposition of multiple precursor materials. For example, a layer can be formed using two or more different precursor materials. Tin oxide coatings made with monobutyltin trichloride (MBTC) typically provide coatings with lower haze than other tin precursors, such as tin tetrachloride (TTC). However, the deposition efficiency for TTC is better than MBTC. Also, TTC tends to produce a coating with a lower sheet resistance than a coating made from MBTC. Therefore, the layer can initially be formed using MBTC (for haze) and then the precursor material switched to TTC to form the remainder of the layer. The overall efficiency is increased and the resultant coating has the haze benefits of MBTC and the sheet resistance benefits of TTC.

An exemplary method of operating the float glass system 10 will now be described.

With respect to FIG. 1, as the glass ribbon 30 travels under the first nanoparticle coater 44, nanoparticles 114 are propelled by the carrier fluid toward the surface 32 of the glass ribbon 30. Due to the relatively low mass of most nanoparticles, the depth of penetration of the nanoparticles 114 is principally determined by the viscosity of the glass ribbon 30. The lower the viscosity of the glass ribbon 30, the farther into the glass ribbon 30 the nanoparticles 114 will penetrate. The velocity of the carrier fluid can also impact the depth of penetration. The higher the velocity, the deeper the nanoparticles 114 will penetrate into the glass ribbon 30.

The first nanoparticle coater 44 can be located at a position in the float bath 14 where the viscosity of the glass ribbon 30 corresponds to the viscosity needed to allow the nanoparticles 114 to penetrate the glass ribbon 30 to a desired depth. Alternatively, if the viscosity of the glass ribbon 30 under the first nanoparticle coater 44 is higher than that desired, one or both of the combustion slots 50, 52 can be activated. For example, fuel and oxidizer can be fed to the first combustion slot 50 and ignited to form a first flame 116. The first flame 116 from the first combustion slot 50 heats the surface 32 of the glass ribbon 30, lowering the viscosity of the glass ribbon 30 to the desired level to allow the nanoparticles 114 to penetrate to a desired depth. Alternatively or additionally, the second combustion slot 52 can be activated to form a second flame 118. The second flame 118 from the second combustion slot 52 also lowers the viscosity of the glass ribbon 30. The second flame 118 can also help smooth over (decrease the roughness) of the surface 32 of the glass ribbon 30 after addition of the nanoparticles 114.

Multiple nanoparticle meters 44, 64 can be used. For example, as shown in FIGS. 1 and 2, the first nanoparticle coater 44 is located closer to the entrance end 26 of the float bath 14 where the temperature of the glass ribbon 30 is greater (and thus the viscosity lower) than at the position of the second nanoparticle coater 64. Thus, all other factors remaining equal, nanoparticles 114 deposited at the first nanoparticle coater 44 will penetrate farther into the glass ribbon 30 than nanoparticles 114 deposited at the second nanoparticle coater 64. In this way, different regions or bands of nanoparticles can be formed in the glass ribbon 30. For example, the first nanoparticle coater 44 can deposit first nanoparticles 120 having a different mass and/or composition than second nanoparticles 122 deposited from the second nanoparticle coater 64.

One or more coating layers can be applied over the surface 32 of the glass ribbon 30 by the one or more vapor deposition coaters 74.

Figure 6:
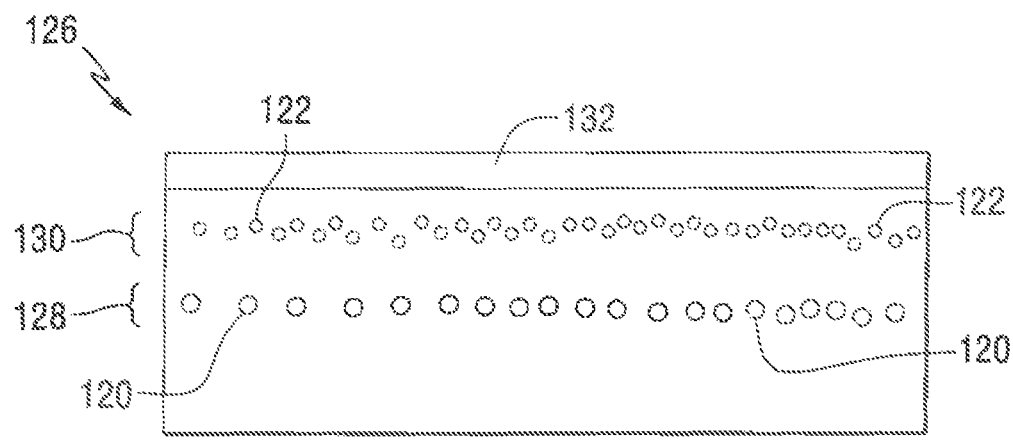
FIG. 6 is a side, sectional view of an article of the invention having nanoparticle regions in the article.

FIG. 6 illustrates an article 126 in which first nanoparticles 120 having a first dimension and/or mass and/or composition are deposited from the first nanoparticle coater 44 to a first depth in the glass ribbon 30. Second nanoparticles 122 having a second dimension and/or mass and/or composition are deposited from the second nanoparticle coater 64 to a second depth in the glass ribbon 30. The first nanoparticles 120 form a first nanoparticle band or nanoparticle region 128 and the second nanoparticles 122 form a second nanoparticle band or nanoparticle region 130 in the glass ribbon 30. The first region 128 is at a different depth in the glass ribbon 30 than the second region 130. In the illustrated example the first nanoparticle region 128 and the second nanoparticle region 130 do not overlap. However, at least a portion of the first nanoparticle region 128 can overlap with at least a portion of the second nanoparticle region 130.

The location of the nanoparticle coater 44, 64 with respect to the attenuation zone 40 impacts upon the concentration of the nanoparticles, for example the number concentration of the nanoparticles, in the glass ribbon 30. For example, if the nanoparticle coater 44, 64 is located upstream of the attenuation zone 40, when the glass ribbon 30 is stretched in the attenuation zone 40, the number concentration and/or density and/or distance (lateral and/or vertical) between the nanoparticles in the glass ribbon 30 can be affected. For example, if the nanoparticles are deposited upstream of the attenuation zone 40 and then the glass ribbon 30 enters the attenuation zone 40 and is stretched laterally, the thickness of the glass ribbon 30 will decrease. The distance, for example the lateral distance, between adjacent nanoparticles will increase.

If the nanoparticle coater 44, 64 is located downstream of the attenuation zone 40, the relative positioning of the nanoparticles should remain the same as the glass ribbon 30 moves through the remainder of the float bath 14.

After the nanoparticles are deposited by the nanoparticle coater 44, 64, one or more optional coating layers can be applied by the one or more vapor deposition coaters 74 located in the float bath 14. The article 126 in FIG. 6 illustrates an optional coating 132 applied by one or more vapor coaters 174. The coating 132 can be or can include one or more layers for an OLED, as described below. For example, the coating 132 can be a conductive oxide layer.

Additional coating layers can be applied over the coating 132 after the glass ribbon 30 exits the float bath 14. For example, the glass ribbon 30 can be cut to a desired shape and one or more additional coating layers added by any conventional method, such as chemical vapor deposition and/or MSVD. Alternatively, nanoparticles 120, 122 can be deposited onto and/or into the glass ribbon 30 by the nanoparticle coater 44, 64 without the application of any subsequent coating layers by the vapor coater 74.

Figure 7:
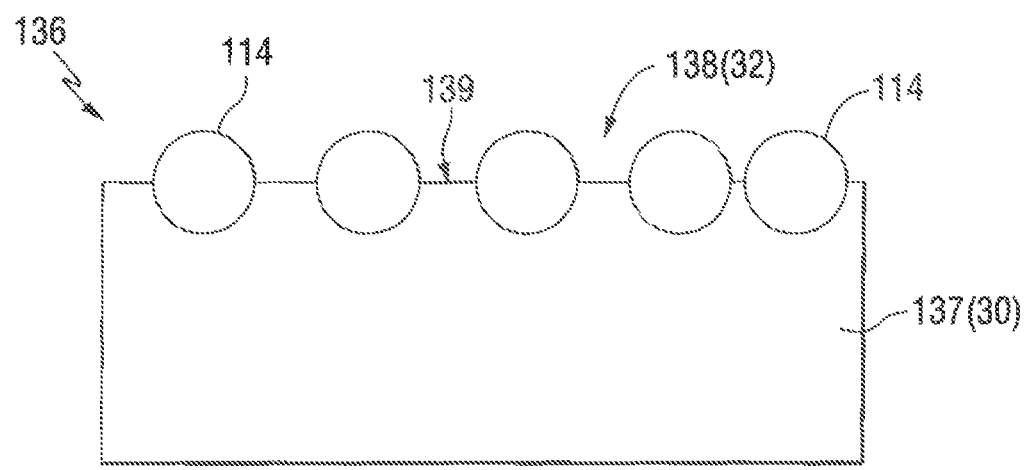
FIG. 7 is a side, sectional view of an article of the invention having a friction modification surface on a surface of the article.

FIG. 7 illustrates an article 136 having a substrate 137 with nanoparticles 114 deposited on a surface 139 of the substrate 137 to form a friction modification surface 138. For example, the nanoparticles 114 can be deposited onto the surface 32 of the glass ribbon 30 at a viscosity of the glass ribbon 30 and/or a velocity of deposition such that the nanoparticles 114 do not fully embed into the glass ribbon 30. The partially embedded nanoparticles 114 form the friction modification surface 138 on the article 136. For example, the nanoparticles 114 can be selected from materials having a lower coefficient of friction than the glass surface 139. The portion of the nanoparticles 114 extending above the surface 139 of the substrate 137 provide the surface 139 with a lower coefficient of friction than would be present without the nanoparticles 114. An example, the nanoparticles 114 can comprise titania. Alternatively, the nanoparticles 114 can be selected to have a higher coefficient of friction than glass of the substrate 137. This would provide the article 136 with a friction modification surface 138 having a higher coefficient of friction than the surface 139 without the nanoparticles 114.

Figure 8:
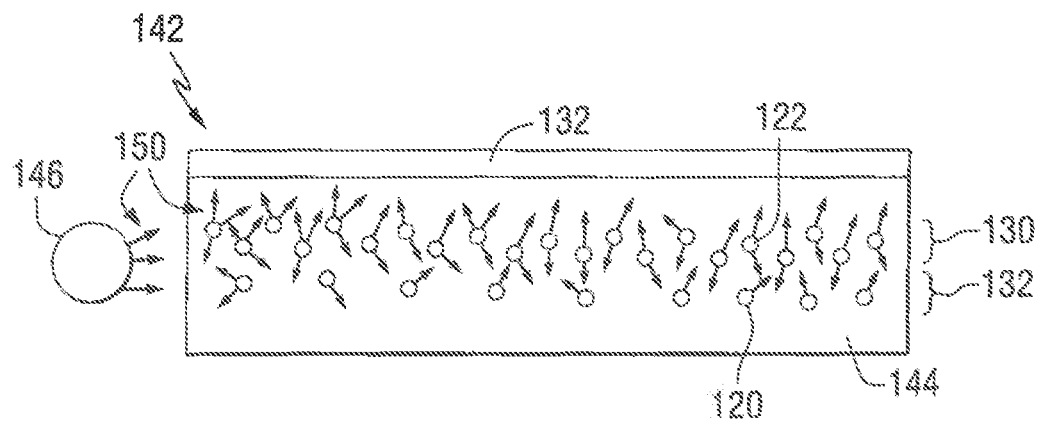
FIG. 8 is a side, sectional view of an article of the invention in the form of a privacy glazing.

Another exemplary article 142 of the invention is shown in FIG. 8. This article 142 is similar to the article 126 shown in FIG. 6. This article 142 is particularly well suited for use as a privacy glazing. The article 142 includes a glass substrate 144 with at least one nanoparticle region 130, 132 adjacent the surface 32. An optional coating 132 may be present. A light source 146 is located adjacent an edge 148 of the article 142. When the light source 146 is deactivated, the article 142 has a first transparency level. When the light source 146 is activated, the nanoparticles 114 scatter the light waves 150 from the light source 146 and the article 142 has a second transparency level. The second transparency level is less than the first transparency level due to the scattering of the light waves 150 by the nanoparticles 120, 122.

Figure 9:
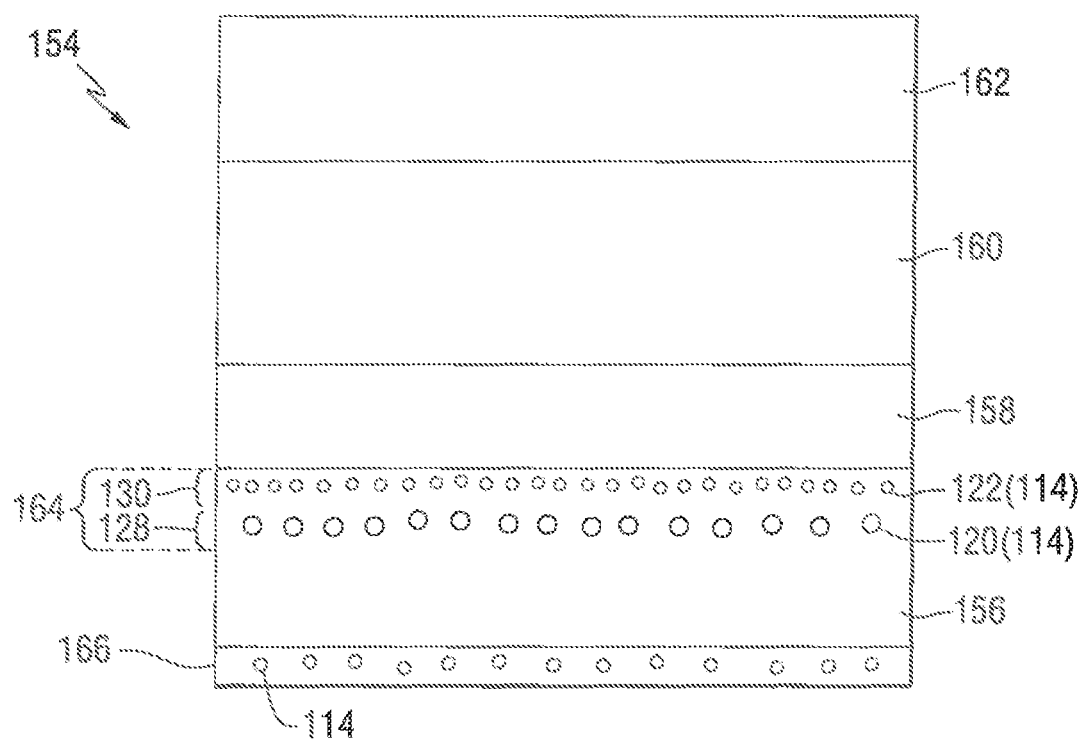
FIG. 9 is a side, sectional view of an article of the invention in the form of an OLED device.

An OLED device 154 incorporating features of the invention is shown in FIG. 9. The OLED device 154 includes a substrate 156, an electrode, such as a cathode 158, an emissive layer 160, and another electrode, such as an anode 162.

The cathode 158 can be any conventional OLED cathode. Examples of suitable cathodes 158 include metals, such as but not limited to, barium and calcium. The cathode 158 typically has a low work function.

The emissive layer 160 can be a conventional organic electroluminescent layer as known in the art. Examples of such materials include, but are not limited to, small molecules such as organometallic chelates (e.g., $Alq_3$), fluorescent and phosphorescent dyes, and conjugated dendrimers. Examples of suitable materials include triphenylamine, perylene, rubrene, and quinacridone. Alternatively, electroluminescent polymeric materials are also known. Examples of such conductive polymers include poly(p-phenylene vinylene) and polyfluorene. Phosphorescent materials could also be used. Examples of such materials include polymers such as poly(n-vinylcarbazole) in which an organometallic complex, such as an iridium complex, is added as a dopant.

The anode 162 can be a conductive, transparent material, such as a metal oxide material, such as, but not limited to, indium tin oxide (ITO) or aluminum-doped zinc oxide (AZO). The anode 162 typically has a high work function.

The substrate 158 comprises a glass substrate and can be made with the float glass system 10 described above. The substrate 156 has a high visible light transmission at a reference wavelength of 550 nanometers (nm) and a reference thickness of 3.2 mm. By "high visible light transmission" it is meant visible light transmission at 550 nm of greater than or equal to 85%, such as greater than or equal to 87%, such as greater than or equal to 90%, such as greater than or equal to 91%, such as greater than or equal to 92%, such as greater than or equal to 93%, such as greater than or equal to 95%, at a 3.2 mm reference thickness. For example, the visible light transmission can be in the range of 85% to 100%, such as 87% to 100%, such as 90% to 100%, such as 91% to 100%, such as 92% to 100%, such as 93% to 100%, such as 94% to 100%, such as 95% to 100%, such as 96% to 100% at a 3.2 mm reference thickness and for a wavelength of 550 nm. Non-limiting examples of glass that can be used for the practice of the invention include, but are not limited to, Starphire®, Solarphire®, Solarphire® PV, and CLEAR™ glass, all commercially available from PPG Industries, Inc. of Pittsburgh, Pa.

The substrate 158 can have any desired thickness, such as in the range of 0.5 mm to 10 mm, such as 1 mm to 10 mm, such as 1 mm to 4 mm, such as 2 mm to 3.2 mm.

The substrate 156 includes an internal light extraction region 164 formed by one or more nanoparticle regions 128 and/or 130, as described above. Examples of suitable nanoparticles include, but are not limited to, oxide nanoparticles. For example but not limited to alumina, titania, cerium oxide, zinc oxide, tin oxide, silica, and zirconia. Other examples include metallic nanoparticles. For example but not limited to iron, steel, copper, sliver, gold, and titanium. Further examples include alloy nanoparticles containing alloys of two or more materials. Additional examples include sulfide-containing nanoparticles and nitride-containing nanoparticles.

The nanoparticles 114 of the internal light extraction region 164 can comprise luminescent and/or phosphorescent nanoparticles 114 as described above. When the emissive layer 160 emits electromagnetic radiation, this radiation can be absorbed by the nanoparticles 114, which then emit electromagnetic radiation themselves. Thus, the nanoparticles 114 not only provide increased light scattering but also increase the electromagnetic radiation output of the OLED. Additionally, the phosphors chosen for the nanoparticles can be selected to emit a color of electromagnetic radiation that, when combined with the electromagnetic radiation emitted from the emissive layer 160, provides electromagnetic radiation of a desired color. For example, if the emissive layer 160 emits blue light, the luminescent and/or phosphorescent nanoparticles 114 can be selected to emit red light, which combine to form a greenish light.

These nanoparticles can be incorporated into the substrate 156 at a depth in the range of 0 microns to 50 microns, such as 0 microns to 10 microns, such as 0 micron to 5 microns. For example, such as 0 microns to 3 microns.

The OLED device 154 can include an external light extraction region 166. The EEL can be, for example, a coating having nanoparticles 114 distributed in the coating.

The nanoparticles can be incorporated into the coating material in the range of 0.1 weight percent to 50 weight percent, such as 0.1 weight percent to 40 weight percent, such as 0.1 weight percent to 30 weight percent, such as 0.1 weight percent to 20 weight percent, such as 0.1 weight percent to 10 weight percent, such as 0.1 weight percent to 8 weight percent, such as 0.1 weight percent to 6 weight percent, such as 0.1 weight percent to 5 weight percent, such as 0.1 to 2 weight percent, such as 0.1 to 1 weight percent, such as 0.1 to 0.5 weight percent, such as 0.1 to 0.4 weight percent, such as 0.1 to 0.3 weight percent, such as 0.2 weight percent to 10 weight percent, such as 0.2 weight percent to 5 weight percent, such as 0.2 weight percent to 1 weight percent, such as 0.2 weight percent to 0.8 weight percent, such as 0.2 weight percent to 0.4 weight percent.

The invention is not limited to the float glass process. The invention can be practiced, for example, with a glass drawdown process. In a drawdown process, molten glass is located in a receiver. The molten glass flows out of the receiver and forms a glass ribbon. The glass ribbon moves downwardly under the influence of gravity. Examples of drawdown processes include a slot drawdown process and a fusion drawdown process. In a slot drawdown process, the receiver is an elongated container or trough having an open discharge slot in the bottom of the trough. Molten glass flows through the discharge slot to form the glass ribbon. In a fusion drawdown process, the receiver is a trough having an open top but without a discharge slot in the bottom of the trough. Molten glass flows out of the top of the trough, down the opposed outer sides of the trough, and forms a glass ribbon under the trough.

Figure 10:
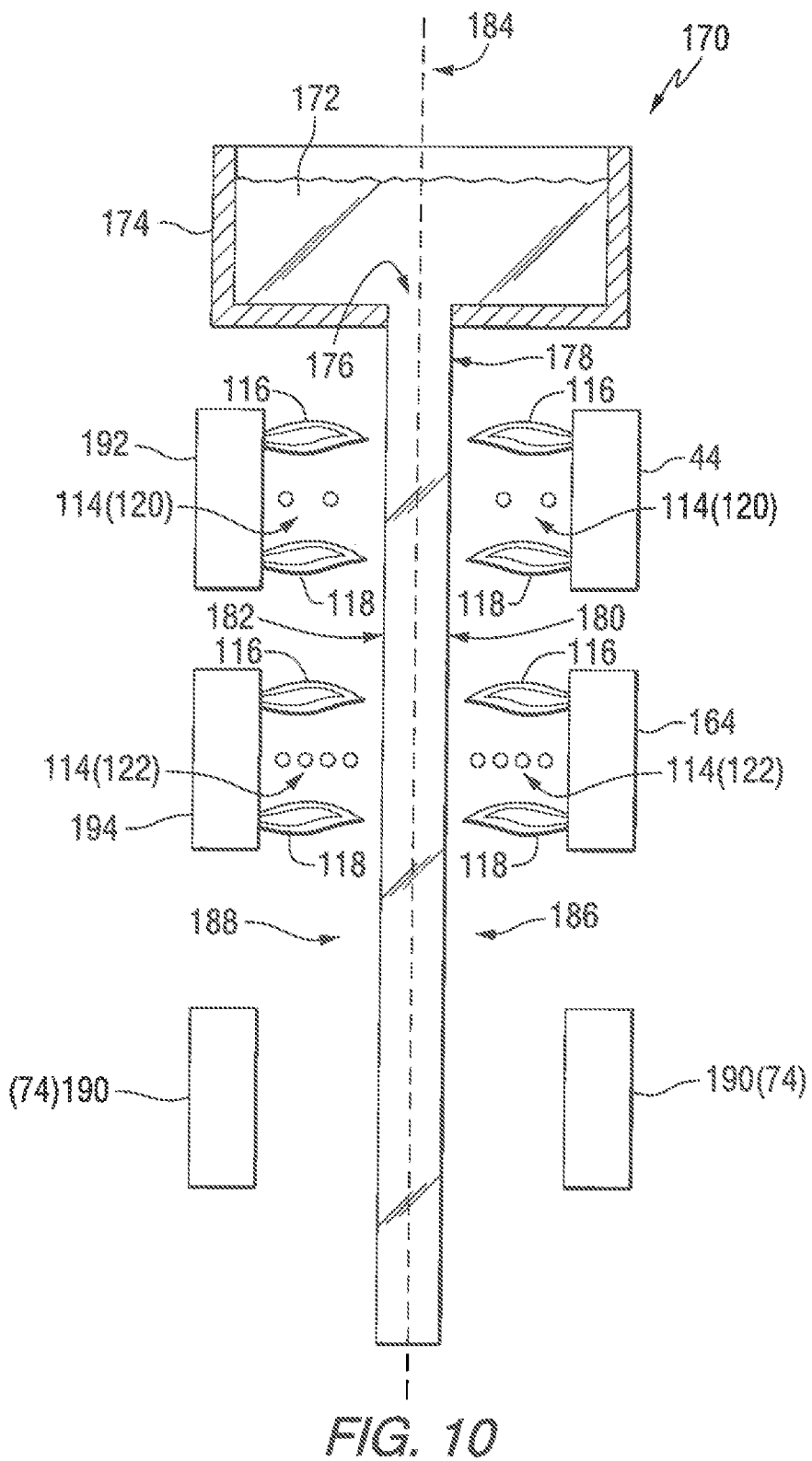
FIG. 10 is a schematic view of a drawdown coating system of the invention.

FIG. 10 illustrates an exemplary drawdown system 170 configured as a slot drawdown system. Molten glass 172 is located in a container 174, such as a trough, having a discharge slot 176 in the bottom of the container 174. The molten glass 172 flows out of the discharge slot 176 and forms a glass ribbon 178 having a first side 180 and a second side 182. The glass ribbon 178 moves downwardly under the force of gravity. The vertical plane along which the glass ribbon 178 moves defines the glass ribbon path 184 for the drawdown system 170. The glass ribbon path 184 has a first side 186 and a second side 188.

One or more nanoparticle coaters are located adjacent the first side 186 of the glass ribbon path 184. In the illustrated example, a first nanoparticle coater 44 is located above a second nanoparticle coater 64. One or more additional coaters 190, for example, CVD coaters and/or spray coaters and/or flame spray coaters and/or vapor coaters, can be located adjacent the first side 186 of the glass ribbon path 184. The additional coater 190 can be, for example, a vapor coater 74 as described above.

One or more nanoparticle coaters are located adjacent the second side 188 of the glass ribbon path 184. In the illustrated example, a third nanoparticle coater 192 is located above a fourth nanoparticle coater 194. The third nanoparticle water 192 and fourth nanoparticle coater 194 can be the same as the nanoparticle coater 44, 64 described above. One or more additional coaters 190, for example, CVD coaters and/or spray coaters and/or flame spray waters and/or vapor coaters, can be located adjacent the second side 188 of the glass ribbon path 184. The additional coater 190 can be, for example, a vapor coater 74 as described above.

One or more nanoparticle regions can be deposited by the nanoparticle coaters 44, 64, 192, 194 onto and/or into one or both sides 180, 182 of the glass ribbon 178. For example and as shown in FIGS. 11-14, one or more first and/or second nanoparticle regions 128, 130 can be formed by the first and/or second nanoparticle coaters 44, 64. One or more third and/or fourth nanoparticle regions 228, 230 can be formed by the third and/or fourth nanoparticle waters 102, 194. One or more coating layers 202 can be applied over one or both sides 180, 182 of the glass ribbon 178 by the additional meters 190.

Figure 11:
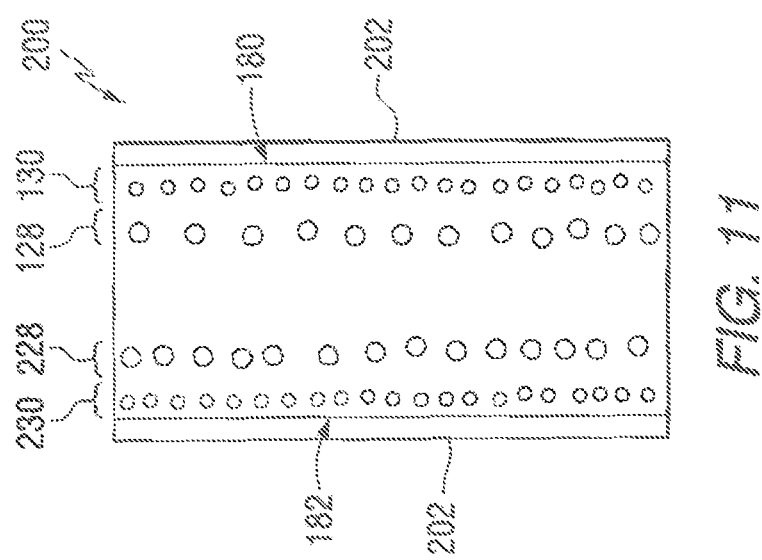
FIG. 11 is a side, sectional view of an article made by the drawdown coating system of FIG. 10 having nanoparticle regions adjacent the opposed major sides of the article.

FIG. 11 illustrates an article 200 similar to that shown in FIG. 6 but made with a drawdown system 170 of the invention. One or more first and/or second nanoparticle regions 128, 130 can be located adjacent the first side 180 of the article 200. One or more third and/or fourth nanoparticle regions 228, 230 can be located adjacent the second side 182 of the article 200. Optional coatings 202 deposited by the additional coaters 190 can be located on the first side 180 and/or the second side 182 of the article 200.

Figure 12:
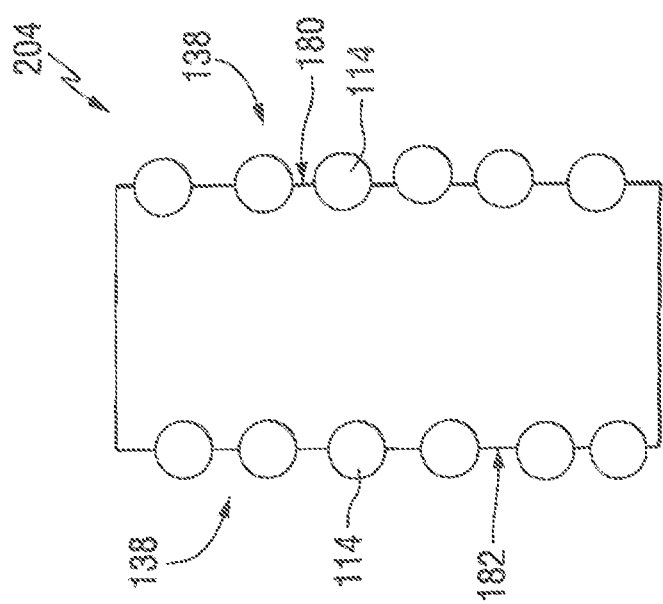
FIG. 12 is a side, sectional view of article of the invention having a friction modification surface on opposed major sides of the article.

FIG. 12 illustrates an article 204 similar to that shown in FIG. 7 but made with a drawdown system 170 of the invention. The article 204 includes a friction modification surface 138 formed on each side 180, 182 of the article 204.

Figure 13:
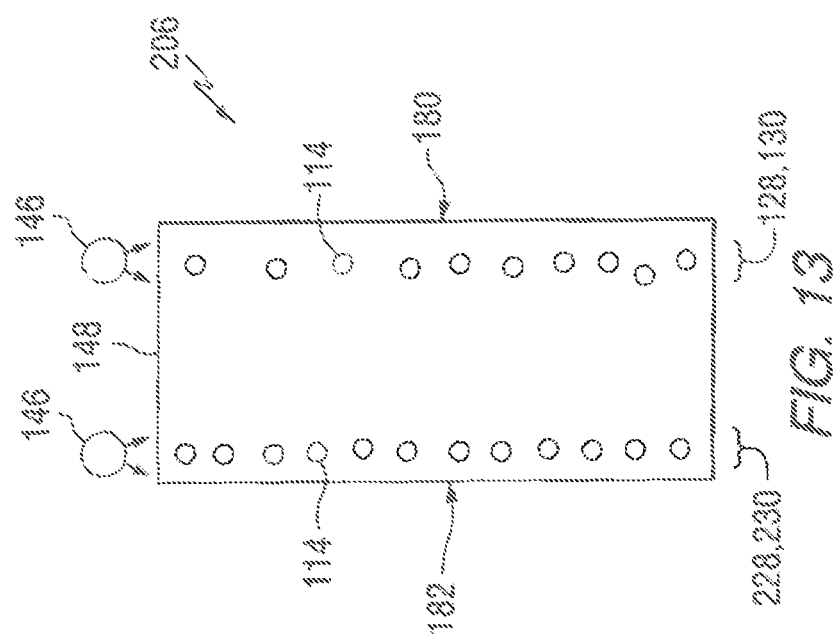
FIG. 13 is a side, sectional view of an article of the invention in the form of a privacy glazing.

FIG. 13 illustrates an article 206 similar to that shown in FIG. 8 but made with a drawdown system 170 of the invention. The article 206 includes one or more first and/or second nanoparticle regions 128, 130 adjacent the first surface 180 and one or more third and/or fourth nanoparticle regions 228, 230 adjacent the second side 182. Light sources 146 are located adjacent an edge 148 of the article 206 adjacent the nanoparticle regions 128, 130, 228, 230.

Figure 14:
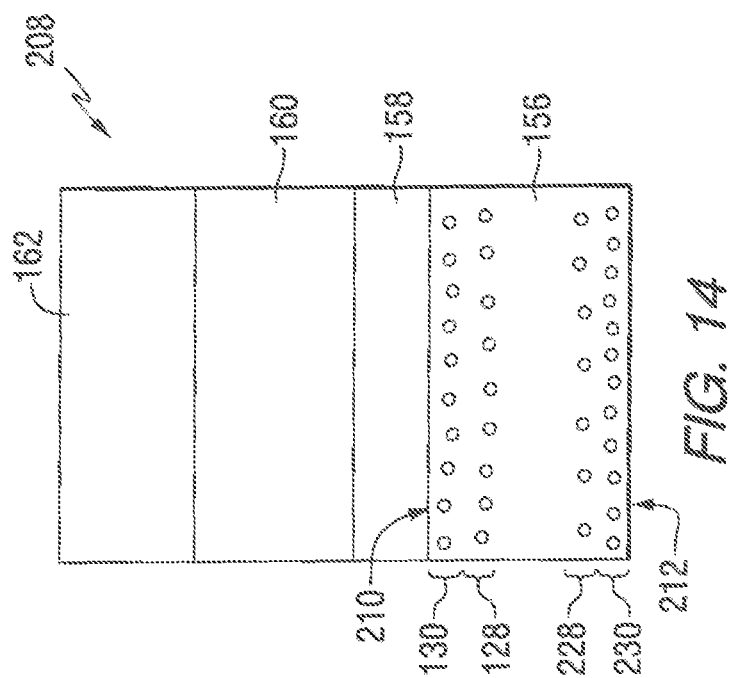
FIG. 14 is a side, sectional view of an article of the invention in the form of an OLED having light extraction regions adjacent opposed major sides of the substrate.

FIG. 14 illustrates an article 208 in the form of an OLED device similar to that shown in FIG. 8 but in which the substrate 156 is made with a drawdown system 170 of the invention. The substrate 156 includes one or more first and/or second nanoparticle regions 128, 130 adjacent a first surface 210 and one or more third and/or fourth nanoparticle regions 228, 230 adjacent a second surface 212.

It will be readily appreciated by one of ordinary skill in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A float bath coating system, comprising:
at least one nanoparticle coater located in a float bath; and
at least one vapor deposition coater located downstream of the at least one nanoparticle coater,
wherein the at least one nanoparticle coater comprises:
a housing;
a nanoparticle discharge slot connected to a nanoparticle source and a carrier fluid source for depositing nanoparticles from the nanoparticle source directly onto a glass ribbon;
a first combustion slot located upstream from the nanoparticle discharge slot, the first combustion slot configured to ignite a first flame, wherein the first flame is configured to heat a surface of a glass ribbon; and
a second combustion slot configured to ignite a second flame, wherein the second flame is configured to heat the surface of the glass ribbon at a location that is separate from the first flame such that the first flame and the second flame heat the surface of the glass ribbon at locations that are separate from one another and wherein the second flame is configured to heat the surface of the glass ribbon to smooth over the surface of the glass ribbon after deposition of the nanoparticles, wherein the nanoparticle discharge slot is connected to the carrier fluid source, the first combustion slot is connected to a first fuel source and a first oxidizer source, and the second combustion slot is connected to a second fuel source and a second oxidizer source, and wherein the fuel and oxidizer flow rates for the first combustion slot and the second combustion slot are configured to be controlled separately and independently from each other and from the nanoparticle source and carrier fluid flow rates.

2. The system of claim 1, wherein the float bath includes an attenuation region and the at least one nanoparticle coater is located upstream of the attenuation region.

3. The system of claim 1, wherein the float bath includes an attenuation region and the at least one nanoparticle coater is located downstream of the attenuation region.

4. The system of claim 1, wherein the nanoparticle source comprises metal oxide nanoparticles.

5. The system of claim 1, wherein the nanoparticle source comprises luminescent and/or phosphorescent nanoparticles.

6. The system of claim 5, wherein the nanoparticle source comprises phosphors.

7. The system of claim 1, wherein the nanoparticle source comprises luminous nanocrystalline nanoparticles.

8. The system of claim 1, wherein the first fuel source comprises natural gas.

9. The system of claim 8, wherein the first oxidizer source comprises oxygen.

10. The system of claim 1, wherein the nanoparticle discharge slot is located between the first combustion slot and the second combustion slot.

11. The system of claim 1, including a first nanoparticle coater and a second nanoparticle coater.

12. The system of claim 11, wherein the first nanoparticle coater is connected to a first nanoparticle source and the second nanoparticle coater is connected to a second nanoparticle source.

13. The system of claim 12, wherein the first nanoparticle source is different than the second nanoparticle source.

14. The system of claim 11, wherein the first nanoparticle coater is connected to a first fuel source and a first oxidizer source, and the second nanoparticle coater is connected to a second fuel source and a second oxidizer source.

15. The system of claim 14, wherein the first fuel source is different than the second fuel source.

16. A float bath coating system, comprising:
at least one nanoparticle coater located in a float bath, wherein the at least one nanoparticle coater comprises a housing, the housing including a nanoparticle discharge slot, a first combustion slot, and a second combustion slot extending therethrough, wherein the nanoparticle discharge slot is connected to a nanoparticle source and a carrier fluid source and the nanoparticle discharge slot deposits nanoparticles from the nanoparticle source directly onto a glass ribbon, wherein the first combustion slot is connected to a first fuel source and a first oxidizer source, wherein the second combustion slot is connected to a second fuel source and a second oxidizer source, wherein the first combustion slot is located upstream from the nanoparticle discharge slot, the first combustion slot configured to form a first flame directed toward the glass ribbon to heat a surface of the glass ribbon and the second combustion slot is configured to form a second flame directed toward the surface of the glass ribbon at a location that is separate from the first flame such that the first flame and the second flame heat the surface of the glass ribbon at locations that are separate from one another, wherein the fuel and oxidizer flow rates for the first combustion slot and the second combustion slot are configured to be controlled separately and independently from each other and from the nanoparticle source and carrier fluid flow rates.

17. The float bath coating system of claim 16, wherein the second flame is directed toward the glass ribbon to smooth the surface of the glass ribbon after nanoparticles are added to the glass ribbon.

18. The system of claim 1, wherein the nanoparticle discharge slot is positioned between the first combustion slot and the second combustion slot and wherein the first combustion slot and second combustion slot are configured to direct the first and second flames toward the glass ribbon.

19. The system of claim 1, wherein the first combustion slot is configured to be selectively activated to control a depth of penetration of the nanoparticles into the glass ribbon.

* * * * *